United States Patent [19]
Reudink et al.

[11] Patent Number: 5,955,920
[45] Date of Patent: Sep. 21, 1999

[54] SIGNAL FEED MATRIX LPA REDUCTION SYSTEM AND METHOD

[75] Inventors: Douglas O. Reudink, Bellevue; Todd Elson, Seattle; Gary Allen Martek, Kent, all of Wash.

[73] Assignee: Metawave Communications Corporation, Redmond, Wash.

[21] Appl. No.: 08/902,057

[22] Filed: Jul. 29, 1997

[51] Int. Cl.[6] .................................................. H03F 3/68
[52] U.S. Cl. ............................... 330/124 R; 330/124 D; 333/109
[58] Field of Search ........................... 330/124 R, 124 D, 330/295; 333/109, 116, 117; 342/373

[56] References Cited

U.S. PATENT DOCUMENTS

| | | | |
|---|---|---|---|
| 3,731,217 | 5/1973 | Gerst et al. | 330/56 |
| 4,618,831 | 10/1986 | Egami et al. | 330/295 X |
| 4,644,301 | 2/1987 | Hecht et al. | 333/101 |
| 5,055,798 | 10/1991 | Heinzelmann | 330/295 |
| 5,280,292 | 1/1994 | Tondryk | 342/373 |
| 5,373,299 | 12/1994 | Ozaki et al. | 333/116 X |
| 5,604,462 | 2/1997 | Gans et al. | 330/124 R |
| 5,675,285 | 10/1997 | Winters | 330/124 R |
| 5,790,517 | 8/1998 | Meredith | 370/210 |

OTHER PUBLICATIONS

Butler Network Extension to any Number of Antenna Ports: Article appearing in *IEEE Transactions on Antennas and Propagation*, Nov., 1970 by H.E. Foster et al., pp. 818–820.

*Primary Examiner*—Steven J. Mottola
*Attorney, Agent, or Firm*—Fulbright & Jaworski L.L.P.

[57] ABSTRACT

A system and method for providing distributed amplification of a plurality of input signals is disclosed. The preferred embodiment of the disclosed invention utilizes two substantially different matrixes to dissect an input signal for amplification and subsequent recombination. The unique matrixes disclosed provide for the distributed amplification of any even number of input signals, therefore reducing the number of linear power amplifiers required where a number of input signals other than a power of two are used.

41 Claims, 7 Drawing Sheets

SIGNAL FEED MATRIX LPA REDUCTION SYSTEM AND METHOD

RELATED APPLICATIONS

The present application is being concurrently filed with U.S. application, Ser. No. 08/901,932, entitled "SIGNAL FEED MATRIX AMPLIFIER REDUCTION SYSTEM AND METHOD", having a common assignee, which application is hereby incorporated by reference.

TECHNICAL FIELD OF THE INVENTION

This invention relates to a signal power amplification system and more particularly to a system and method for reducing the number of power amplifiers necessary in a signal feed matrix while maintaining the desired power distribution, beam forming, and signal quality.

BACKGROUND OF THE INVENTION

It is common in the art to utilize an antenna array comprised of a plurality of antenna elements in order to illuminate a selected area with a signal or signals. Often such an array is used in combination with beam forming techniques, such as phase shifting the signal associated with particular antenna elements of the array, such that the signals from the excited elements combine to form a desired beam, or radiation pattern, having a predetermined shape and/or direction. Similarly, the antenna elements of such an array may each provide illumination of a select area, or sector, of the array's total radiation pattern, thus providing designated signals to a selected area.

Irrespective of their use to provide adaptive techniques or to provide signal coverage within a sector, these antenna elements must typically be provided signals having some component unique to the particular antenna element for which it is to excite. For example, where the array utilizes beam steering, adjacent antenna elements may each be provided with a signal having common information content but phase shifted in order to form a desired composite radiated signal. Likewise, where the array utilizes the individual antenna elements to provide signals within selected sectors, only those antenna elements associated with particular sectors need be provided with a signal (i.e., the power component of the signal at an antenna element associated with an unused sector may be zero).

Therefore, it is often desirable to provide signal input paths sufficient in number to result in the controllable excitation of the antenna columns as described above. For example, where sixteen antenna elements are to be utilized in an array, sixteen signal input paths, each associated with a particular antenna element, may be utilized.

In addition to the ability to apply a selected signal to particular ones of the antenna elements, in order to provide a signal of sufficient amplitude, it is often desirable to provide amplification in each of the signal input paths. One method of providing such signal amplification is to provide linear power amplifiers (LPA) in signal paths directly coupled to each antenna element. In our example, having sixteen signal input paths associated with sixteen antenna elements, this method requires sixteen LPAs, or one LPA coupled to each antenna element.

However, LPAs are expensive and often cumbersome to implement. For example, they are relatively heavy and therefore often difficult to deploy in a typical antenna system environment. Similarly, the LPAs are active components consuming power and producing heat as a by-product and are susceptible to failure. Therefore, it is desirable to both reduce the number of LPAs necessary for any particular antenna configuration, as well as to provide for signal transmission to any antenna element even in the case of an inoperative LPA.

An alternative method of providing signals to the antenna elements of an array uses a back to back Butler matrix combination having sixteen LPAs disposed between a Butler matrix and an inverse Butler matrix to provide a distributed amplifier arrangement. The advantage of this arrangement is that a Butler matrix takes a signal input at any of the matrix's inputs and effectively provides a Fourier transform of the signal. This results in an input signal, provided to a single input of the Butler matrix, appearing at each of the matrix's outputs with a linear phase progression (i.e., the input signal is dissected into spectral components each appearing at a different Butler matrix output). By amplifying each of these spectral component signals, and applying the result to an inverse Butler matrix, an amplified version of the original signal, including all of its spectral components, may be had.

Similarly, a back to back hybrid matrix combination having sixteen LPAs disposed between a hybrid matrix and an inverse hybrid matrix providing a distributed amplifier arrangement may be used. Although not a Fourier transform, the input signal is nonetheless provided to each of the matrix's outputs (here, because of the phase shift relationship of the hybrid splitters used, the signals appearing at the hybrid matrix's output are component signals having a phase difference equal to that of the hybrid splitter as between adjacent signal components). As such, by amplifying each of these power component signals, and applying the result to an inverse hybrid matrix, an amplified version of the original signal results. The use of such a hybrid matrix combination is often preferable to the aforementioned Butler matrix combination as the cost associated with a hybrid matrix is considerably lower than that of the Butler matrix.

One advantage of the above described back to back Butler and hybrid matrix arrangements is that, by definition, the arrangements provide distributed amplification of any input signal (i.e., a signal input at any single input signal path is distributed across a number of LPAs). As such, the arrangements provide advantages of distributed amplification, such as amplifier operation in a more linear range as well as fault tolerance for an inoperative LPA.

In contrast to this matrix arrangement, the directly coupled LPA method of providing amplification, described above, must supply all gain associated with any signal through a single amplifier, or series of amplifiers having a single signal path. It becomes readily apparent that such an arrangement provides no fault tolerance for an LPA failure. As the LPAs are simply disposed directly between the signal input path and an associated antenna element, if an LPA fails then the signal path is disrupted and the associated antenna element is no longer provided a signal.

However, in the matrix arrangements, if one or even a number of the LPAs malfunction it is still conceivable that performance may be had from all of the antenna elements. This is so because the first Butler or hybrid matrix distributes components of the input signal along its output. These components are then each amplified by the LPAs and subsequently recombined by the inverse Butler or hybrid matrix to reconstruct the original signal. Accordingly, if a few of the signal components are missing, such as due to failure of one or more of the LPAs, the inverse matrix can still reconstruct the signal fairly accurately. The reconstructed signal is not an exact reproduction of the original signal, but is accurate enough to provide a signal to the right antenna element.

However, it shall be appreciated that, although providing a desired advantage of fault tolerance, it is very difficult, if not impossible, to configure either the back to back Butler or hybrid matrix to provide for input and output signal paths of numbers different than those of the power two (i.e., typical back to back Butler and hybrid matrixes are limited to inputs and outputs numbering 4, 8, 16, . . . $2^n$). Because of this limitation, use of a number of antenna elements differing from a power of two requires a Butler or hybrid matrix having more input and output signal paths than actually utilized. For example, an antenna array having only twelve antenna elements must use a 16×16 Butler matrix while only utilizing twelve of the input paths.

Although the above arrangement will satisfactorily provide the advantages of distributed amplification, it should be appreciated that, because the matrix arrangement distributes any input signal as signal components among all its outputs, a total of sixteen LPAs are required. As described above, it is desirable to reduce the number of LPAs necessary to provide the desired signal to an antenna array. However, where the number of antenna elements is other than a power of two, a distributed amplifier utilizing a back to back matrix arrangement actually requires more LPAs than there are input signals or antenna elements.

Therefore, a need exists in the art for a system and method by which various numbers of input signals associated with an antenna array or other system may be amplified while providing the advantages of a distributed amplifier.

A further need exists in the art for a system and method providing for the distributed amplification of numbers of signals other than powers of two while requiring a minimum number of amplifiers.

A still further need exists in the art for providing suitable fault tolerance in the amplification of a number of signals.

SUMMARY OF THE INVENTION

These and other objects and advantages are present in a system and method utilizing a novel arrangement of hybrid splitters in combination with LPAs to provide distributed amplification. Accordingly, a first and second distinct hybrid matrix, as opposed to a hybrid matrix and inverted hybrid matrix, supply signals to a number of LPAs. However, because of the novel arrangement of the individual hybrid splitters comprising the first and second hybrid matrix, the present invention is not limited to numbers of input signal paths related to powers of two (i.e., $2^n$). Instead, the present invention may be utilized to provide distributed amplification of any even number of inputs. As such, the present invention utilizes fewer LPAs where the number of inputs desired is other than a power of two.

Moreover, because of the novel design of the first and second hybrid matrixes, a signal associated with any particular signal input path is not divided among every LPA of the distributed amplifier, but rather a subset thereof. Therefore, the present invention provides additional fault tolerance in that, in addition to being able to maintain a signal at any antenna element even where one or more LPA is in operative, the failure of any particular LPA will have no effect upon certain signal paths. As such even where a particular LPA has failed, no signal degradation will be experienced at certain of the outputs of the distributed amplifier.

Accordingly, the use of a subset of the available LPAs for distributed amplification of any particular input signal has the additional benefit of reducing the effects of cross-talk. An additional benefit to the fact that no signal degradation is realized at certain outputs upon an LPA's failure, is that cross-talk will only be experienced at the subset of outputs associated with the particular malfunctioning LPA.

Therefore, one technical advantage of the present invention is that distributed amplification may be provided for a number of input signal paths not limited to a power of two.

A further technical advantage of the present invention is provision of system fault tolerance in that the failure of any one signal path does not result in the preclusion of a signal at any one antenna element or other output device. Furthermore, the failure of any one signal path results in only a subset of the antenna elements experiencing signal degradation.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

In order to better understand the features and advantages of the present invention, reference is made to prior art back to back matrix distributed amplifier systems. Directing attention to FIG. 1, a back to back matrix for providing distributed amplification of signals input at inputs 101a–101p, via amplifiers 110a–110p, to outputs 102a–102p is shown. Here matrix 120, a 16×16 matrix which may be a Butler or hybrid matrix, distributes any signal appearing at inputs 101a–101p across all the amplifiers 110a–110p coupled to the outputs of matrix 120. For example, a signal provided to input 101a, $A_0$, will be distributed by matrix 120 as signal components to each of amplifiers 110a–110p.

After amplification by amplifiers 110a–110p, the amplified signal components are provided to inputs of inverse matrix 130, a 16×16 matrix providing signal paths inverse to those of matrix 120. Inverse matrix 130 recombines the signal components to form an amplified version of the original signal. In our example, inverse matrix 130 provides an amplified version of the input signal $A_0$ as $P(A_0)$ at output 102a, where P is the gain factor of distributed amplifiers 110a–110p.

Figure 1:
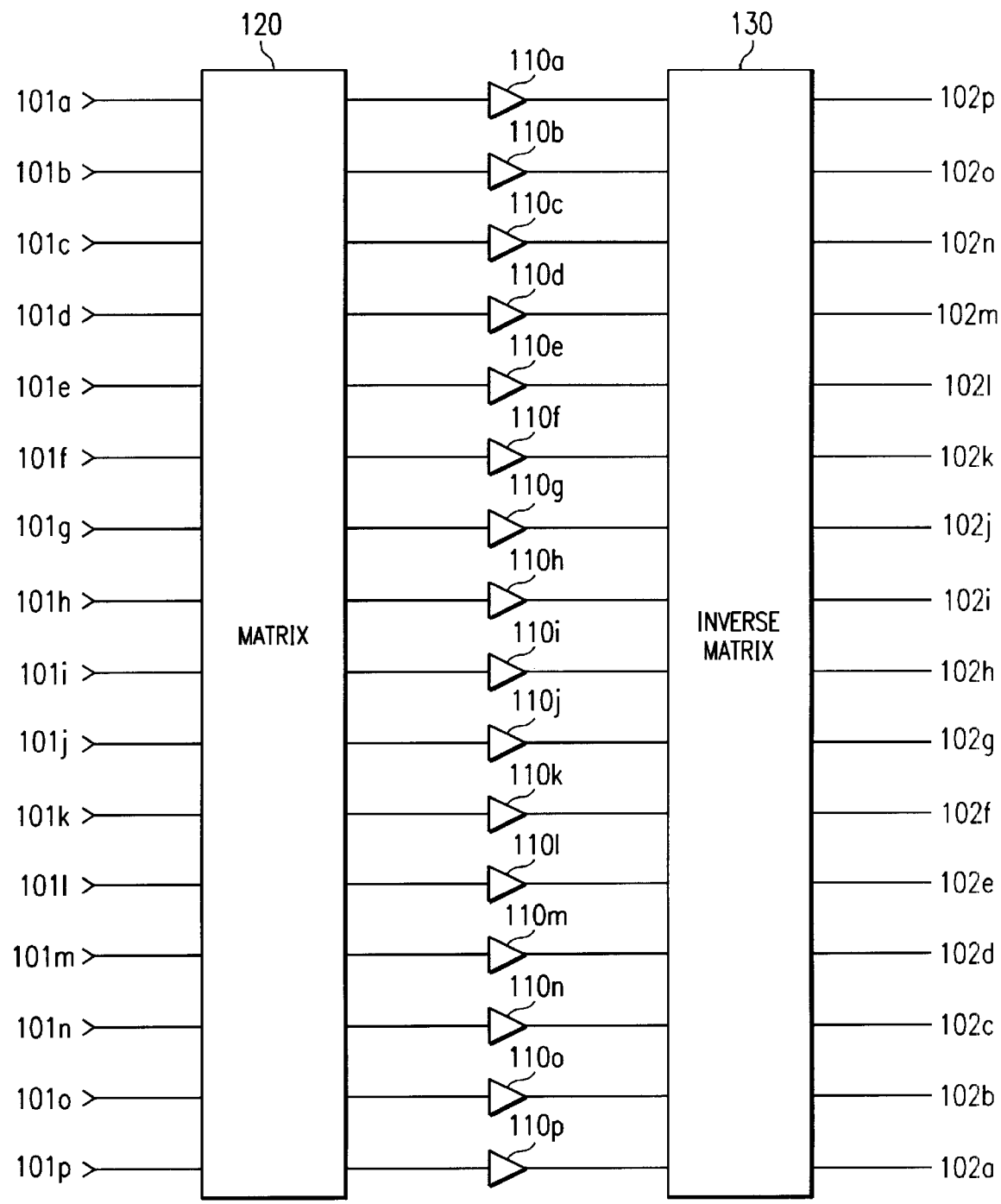
FIG. 1 shows a typical prior art distributed amplifier apparatus.
Figure 2:
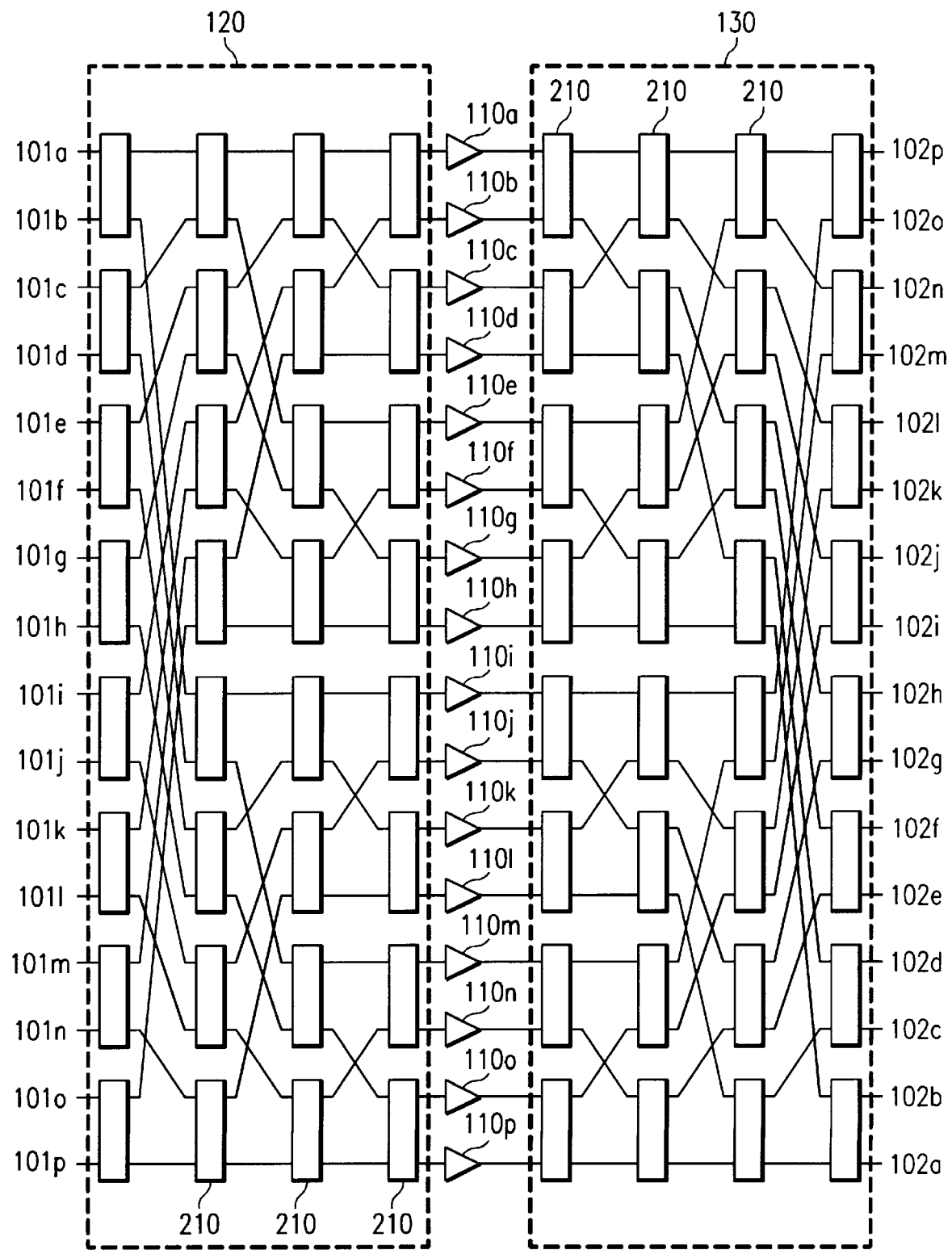
FIG. 2 shows the prior art distributed amplifier apparatus of FIG. 1 utilizing hybrid and inverted hybrid matrixes.

Directing attention to FIG. 2, the back to back matrix distributed amplification system of FIG. 1 is shown utilizing a four stage hybrid matrix in combination with a complementary four stage inverted hybrid matrix. Here 90° hybrid combiners 210 having predetermined interconnections provide dissection of input signals in matrix 120, while hybrid combiners 210 of inverse matrix 130, having interconnections inverse of those in matrix 120, provide recombination of the dissected input signal. It shall be appreciated that, although the components used and signal paths associated therewith are different than those shown, a back to back Butler matrix arrangement (not shown) operates to dissect and recombine input signals much the same as the hybrid matrix illustrated.

By tracing the signal paths associated with the particular hybrid combiners through which any particular input signal must pass, it becomes readily apparent that any signal associated with any input 101a–101p will be provided to each amplifier 110a–110p. Therefore, in our example, the output signal $P(A_0)$ at output 102a will include components amplified by each of amplifiers 110a–110p.

In either of these back to back matrix arrangements, by applying a signal to one input of the first matrix, such as input 101a, while terminating all other input signals and measuring the output of the sixteen ports of the inverse matrix, ideally the output will consist of a signal on one port, output 102a, and no signal on the other ports. Of course in practice this is not quite true because there is coupling between the ports, nevertheless it is a very good approximation. Similarly, other input ports on the first matrix can be excited with all other port terminated and the outputs of the inverse matrix can be measured.

From measuring such input signals, a 16×16 square matrix can be constructed which represents the output signal levels of the sixteen output ports in response to excitations on each of the sixteen input ports. Ideally, the matrix will be a diagonal matrix, which means on its diagonal it will be all ones and all the other values in matrix will be zero. The ones meaning that the output signals correspond exactly to the input signal or, where other than unity gain is provided by the amplifiers, is equal to the input signal times the gain provided by the distributed linear power amplifiers. Assuming the gain provided by the distributed linear power amplifiers is one, or unity, for simplicity, the output will be equal to the corresponding input with each amplifier providing a portion of the output signal.

As such, even when interfaced with a system utilizing a subset of inputs 101a–101p, and therefore also utilizing a subset of outputs 102a–102p, each amplifier 110a–110p is required. For example, where the back to back matrix of FIG. 1 is to be utilized in a system having only twelve inputs and outputs, inputs 101a–101l may be utilized while ignoring inputs 101m–101p (the number of the inputs and outputs required may vary based, for example, on a number of individual antenna elements of an array depending on such design constraints as a desired composite beam width, antenna gain, or the like). However, following the signal paths illustrated in FIG. 2, it becomes readily apparent that, although output signals will be associated only with outputs 102a–102l, each amplifier 110a–110p is utilized.

Utilizing sixteen amplifiers for providing twelve discrete signals is typically undesirable as such amplifiers are generally expensive in addition to the deployment and operational issues associated therewith. As such, it is preferable to reduce the number of amplifiers while still maintaining the benefits of distributed amplification.

However, one of ordinary skill in the art will appreciate that prior art back to back Butler and hybrid matrixes utilized in such distributed amplifiers are limited to implementations having inputs and outputs numbering in a power of two, such as the 16×16 ($2^4$) hybrid matrix of FIG. 2. Therefore, a system requiring only twelve inputs and outputs, or any other number not equating to a power of two, must utilize a number of amplifiers in excess to the number of inputs and outputs when utilizing prior art systems.

One method to reduce the number of linear power amplifiers required in such an implementation is by combining outputs from the input matrix in such a way that adjacent outputs from this matrix are combined, such as through Wilkinson combiners, into a single signal. The outputs of such Wilkinson combiners are then amplified through a reduced number of amplifiers. After the output of each amplifier, a Wilkinson combiner is utilized to then split the amplified signal for provision to adjacent input ports of the inverse matrix.

The use of Wilkinson combiners to reduce the number of amplifiers, as described above, is shown in FIG. 3. As illustrated, eight Wilkinson combiners 303 are disposed between matrix 120 and the amplifiers to combine its output of signal components for amplification by eight amplifiers 110a–110h. Eight additional Wilkinson combiners 303 are disposed between the amplifiers and inverse matrix 130 to split the amplified signals for signal recombination by inverse matrix 130.

According to this solution, only eight LPAs for a 16×16 back to back matrix are utilized. The cost savings from this embodiment are immediately apparent for two reasons: First, only half as many amplifiers are required; Second, replacing these amplifiers are sixteen Wilkinson combiners which are very cheap compared to linear power amplifiers.

However, a draw back of this embodiment is that the highly diagonalized matrix, referred to above as being a 16×16 square matrix with a diagonal of ones and all other elements zero, no longer exists. The reason being that the relationship of the signal components on the outputs of the input matrix are modified. When the amplified signal is split, the previously discrete signals have lost their identity. In the case of a Butler matrix, the outputs from the input matrix are no longer a linear progression, but rather an approximation, due to spectral components being combined. Likewise, in the case of a hybrid matrix, the outputs from the input matrix are no longer component signals having a phase difference equal to that of the hybrid splitter as between adjacent signal components, but rather an approximation due to signal components being combined. Therefore the inverted matrix can no longer effectively, or at least very accurately, reconstruct the original signal. This inability to accurately reconstruct the original input signal manifests itself as a reduction in power at the desired output port of the inverted matrix and an increase in unwanted power in other output ports of the inverted matrix.

Improvement in the output signal of this embodiment may be had at the expense of more linear power amplifiers. Simply by coupling select outputs of the input matrix directly to the amplifiers improved signal reconstruction may be realized. For example, an arrangement directly coupling the outer four output ports of the input matrix to amplifiers and coupling the remaining eight output ports to amplifiers via the aforementioned Wilkinson combiners utilizes twelve amplifiers with only the signals of the inner eight output ports being combined.

The reason this provides better signal reconstruction is, quite clearly, because the relationship of the adjacent signal components of the output ports of the input matrix is not altered as much as in the previous embodiment utilizing eight amplifiers. Hence, the output from this embodiment is somewhat closer to the ideal.

Of course, the reconstructed signal can be improved further by, again, putting in more amplifiers and, thus, reducing the use of Wilkinson combiners. As such, it can be readily appreciated that a trade off exists between the number of amplifiers utilized by any particular matrix configuration and performance as measured by the reconstruction of the input signal.

Therefore, a preferred embodiment of the present invention utilizes matrixes that, although dissecting input signals for provision to a number of amplifiers, does not require a number of amplifiers in excess to the number of discrete inputs and outputs utilized, regardless of each of such inputs and outputs numbering other than a power of two. It shall be appreciated that such an embodiment does not require the use of the above mentioned combiners, which affect the relationship of adjacent signal components and thus the quality of the recombined signal, in order to provide distributed amplification of a 12×12 matrix using only twelve amplifiers.

Figure 4:
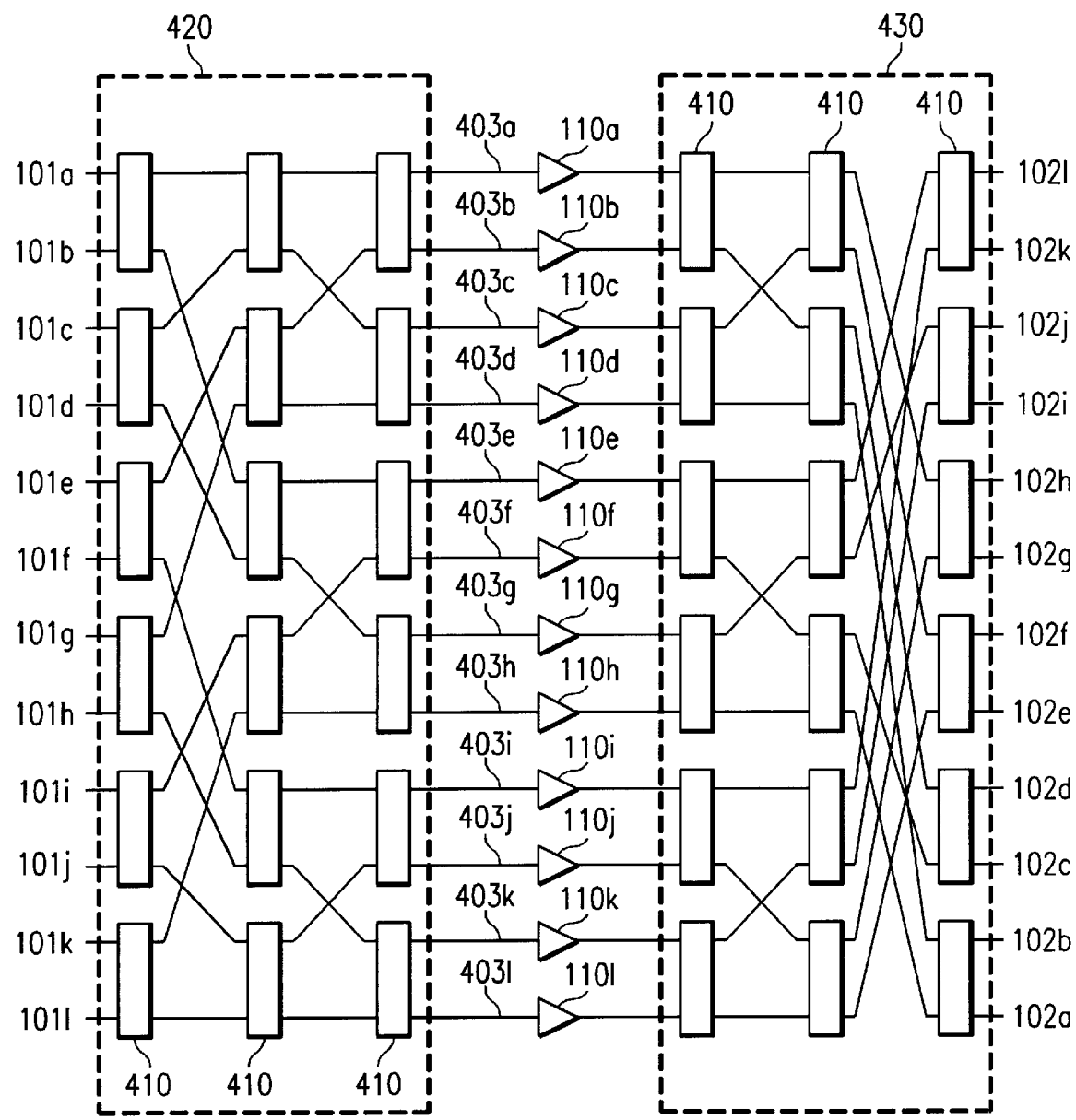
FIG. 4 shows a preferred embodiment of a 12×12 distributed amplifier of the present invention.

Directing attention to FIG. 4, a 12×12 hybrid distributed amplifier matrix according to a preferred embodiment of the present invention is shown. Here input matrix 420 and output matrix 430 utilize hybrid combiners 410 coupled in an inventive way so as to provide distributed amplification utilizing a number of amplifiers other than a power of two.

It shall be appreciated that hybrid combiners 410 have two inputs and two outputs. One input is typically referred to as "IN," or input, and the adjacent one is called "ISO," or isolation. When energy is applied to the input port, the output port directly across will be energized in phase with the input signal. However, the output port disposed diagonal to the input port will lag by 90° (i.e., a −90° phase shift will be introduced into the signal as output by this port). Likewise, when energy is applied to the isolation port, the output port directly across will be energized in phase with this input signal. The signal at the output port disposed diagonal to the isolation port will lag the input signal by 90°. This is therefore a 90° hybrid as the outputs have a 90° relationship with each other. Additionally, it should be appreciated that the power of an input signal is divided equally among the two output ports of a hybrid combiner.

Of course, although the use of hybrids and combiners is discussed herein, it shall be appreciated that any number of components which may alone, or in combination, provide the signal splitting/combining with the appropriate phase shifting as taught herein may be utilized according to the present invention.

Like the aforementioned Butler and hybrid matrixes, input matrix 420 is utilized to dissect signals appearing at any of the twelve inputs 101a–101l for provision of signal components to amplifiers 110a–110l. However, it shall be appreciated that a signal appearing at an input of input matrix 420 is provided to a subset of amplifiers 110a–110l for amplification, rather than all amplifiers as in the above mentioned back to back Butler and hybrid matrixes.

For example, by tracing the interconnections of hybrid combiners 410 in input matrix 420, it becomes readily apparent that a signal appearing at input 101a is provided only to amplifiers 110a–110h. Likewise, a signal appearing at input 101e is provided only to amplifiers 110a–110d and 110i–110l. Advantages of the use of a subset of the available amplifiers will be discussed in more detail below.

As before in the above back to back Butler and hybrid matrixes, output matrix 430 is utilized to recombine amplified signal components in order to reconstruct amplified versions of the signals as appearing at inputs 101a–101l. However, according to the preferred embodiment of the present invention, output matrix 430 is not the inverse of input matrix 420. Instead, output matrix 430 comprises interconnections of hybrid combiners 410 very different than those of input matrix 420.

It shall be appreciated that the unique interconnections of the input and output matrixes of the preferred embodiment provide a distributed amplification matrix having inputs and outputs numbering twelve (i.e., a number not a power of two). Furthermore, as will be discussed in more detail hereinbelow, the present invention may be utilized to provide distributed amplification of any even number of signal inputs and outputs.

Tracing the interconnections of the hybrid combiners of input matrix 420 and output matrix 430 it can be seen that a signal appearing at input 101a will be output at output 102a. Furthermore, understanding that there is a 90° phase relationship between the outputs of the hybrid combiners, through signal splitting and cancellation outputs 102b–102l will theoretically be devoid of any signal component of the signal appearing at input 101a.

In order to more readily see the relationship of the input signals appearing at inputs 101a–101l to the output signal as appears at outputs 102a–102l, mathematical expressions for these signals are presented below. The provision of input signal components to amplifiers 110a–110l may be expressed as:

$$d_0 = \frac{1}{2\sqrt{2}}(A_0 + A_1 e^{-j90°} + A_2 e^{-j90°} + A_3 e^{-j180°} + A_4 e^{-j90°} + A_5 e^{-j180°} + A_6 e^{-j180°} + A_7 e^{-j270°})$$

$$d_1 = \frac{1}{2\sqrt{2}}(A_0 e^{-j90°} + A_1 e^{-j180°} + A_2 e^{-j180°} + A_3 e^{-j270°} + A_4 + A_5 e^{-j90°} + A_6 e^{-j90°} + A_7 e^{-j180°})$$

$$d_2 = \frac{1}{2\sqrt{2}}(A_0 e^{-j90°} + A_1 e^{-j180°} + A_2 + A_3 e^{-j90°} + A_4 e^{-j180°} + A_5 e^{-j270°} + A_6 e^{-j90°} + A_7 e^{-j180°})$$

$$d_3 = \frac{1}{2\sqrt{2}}(A_0 e^{-j180°} + A_1 e^{-j270°} + A_2 e^{-j90°} + A_3 e^{-j180°} + A_4 e^{-j90°} + A_5 e^{-j180°} + A_6 + A_7 e^{-j90°})$$

-continued $$d_4 = \frac{1}{2\sqrt{2}}(A_0 e^{-j90°} + A_1 + A_2 e^{-j180°} + A_3 e^{-j90°} + A_8 e^{-j90°} + A_9 e^{-j180°} + A_{10} e^{-j180°} + A_{11} e^{-j270°})$$

$$d_5 = \frac{1}{2\sqrt{2}}(A_0 e^{-j180°} + A_1 e^{-90°} + A_2 e^{-j270°} + A_3 e^{-j180°} + A_8 + A_9 e^{-j90°} + A_{10} e^{-90°} + A_{11} e^{-j180°})$$

$$d_6 = \frac{1}{2\sqrt{2}}(A_0 e^{-j180°} + A_1 e^{-90°} + A_2 e^{-j90°} + A_3 + A_8 e^{-j180°} + A_9 e^{-j270°} + A_{10} e^{-90°} + A_{11} e^{-j180°})$$

$$d_7 = \frac{1}{2\sqrt{2}}(A_0 e^{-j270°} + A_1 e^{-180°} + A_2 e^{-j180°} + A_3 e^{-j90°} + A_8 e^{-j90°} + A_9 e^{-j180°} + A_{10} + A_{11} e^{-j90°})$$

$$d_8 = \frac{1}{2\sqrt{2}}(A_4 e^{-j90°} + A_5 + A_6 e^{-j180°} + A_7 e^{-j90°} + A_8 e^{-j180°} + A_9 e^{-j90°} + A_{10} e^{-j270°} + A_{11} e^{-j180°})$$

$$d_9 = \frac{1}{2\sqrt{2}}(A_4 e^{-j180°} + A_5 e^{-90°} + A_6 e^{-j270°} + A_7 e^{-j180°} + A_8 e^{-j90°} + A_9 + A_{10} e^{-j180°} + A_{11} e^{-j90°})$$

$$d_{10} = \frac{1}{2\sqrt{2}}(A_4 e^{-j180°} + A_5 e^{-90°} + A_6 e^{-j90°} + A_7 + A_8 e^{-j270°} + A_9 e^{-j180°} + A_{10} e^{-j180°} + A_{11} e^{-j90°})$$

$$d_{11} = \frac{1}{2\sqrt{2}}(A_4 e^{-j270°} + A_5 e^{-180°} + A_6 e^{-j180°} + A_7 e^{-j90°} + A_8 e^{-j180°} + A_9 e^{-j90°} + A_{10} e^{-j90°} + A_{11})$$

Where $A_0$–$A_{11}$ are the input signals appearing at inputs 101a–101l respectively, and $d_0$–$d_{11}$ are the signal components appearing at input matrix 420 outputs 403a–403l respectively.

Recombination of the amplified signal components provided by the output matrix may be expressed as:

$$I_0 = (D_0 e^{-j270°} + D_1 e^{-j180°} + D_2 e^{-j180°} + D_3 e^{-j90°} + D_4 e^{-j180°} + D_5 e^{-j90°} + D_6 e^{-j90°} + D_7)\frac{1}{2\sqrt{2}}$$

$$I_1 = (D_0 e^{-j180°} + D_1 e^{-j90°} + D_2 e^{-j90°} + D_3 + D_4 e^{-j270°} + D_5 e^{-j180°} + D_6 e^{-j180°} + D_7 e^{-j90°})\frac{1}{2\sqrt{2}}$$

$$I_2 = (D_0 e^{-j180°} + D_1 e^{-j90°} + D_2 e^{-j270°} + D_3 e^{-j180°} + D_4 e^{-j90°} + D_5 + D_6 e^{-j180°} + D_7 e^{-j90°})\frac{1}{2\sqrt{2}}$$

$$I_3 = (D_0 e^{-j90°} + D_1 + D_2 e^{-j180°} + D_3 e^{-j90°} + D_4 e^{-j180°} + D_5 e^{-j90°} + D_6 e^{-j270°} + D_7 e^{-j180°})\frac{1}{2\sqrt{2}}$$

$$I_4 = (D_0 e^{-j180°} + D_1 e^{-j270°} + D_2 e^{-j90°} + D_3 e^{-j180°} + D_8 e^{-j270°} + D_9 e^{-j90°} + D_{10} e^{-j90°} + D_{11})\frac{1}{2\sqrt{2}}$$

$$I_5 = (D_0 e^{-j90°} + D_1 e^{-j180°} + D_2 + D_3 e^{-j90°} + D_8 e^{-j270°} + D_9 e^{-j180°} + D_{10} e^{-j180°} + D_{11} e^{-j90°})\frac{1}{2\sqrt{2}}$$

$$I_6 = (D_0 e^{-j90°} + D_1 e^{-j180°} + D_2 e^{-j180°} + D_3 e^{-j270°} + D_8 e^{-j90°} + D_9 + D_{10} e^{-j180°} + D_{11} e^{-j90°})\frac{1}{2\sqrt{2}}$$

$$I_7 = (D_0 + D_1 e^{-j90°} + D_2 e^{-j90°} + D_3 e^{-j180°} + D_8 e^{-j180°} + D_9 e^{-j90°} + D_{10} e^{-j270°} + D_{11} e^{-j180°})\frac{1}{2\sqrt{2}}$$

$$I_8 = (D_4 e^{-j180°} + D_5 e^{-j270°} + D_6 e^{-j90°} + D_7 e^{-j180°} + D_8 e^{-j90°} + D_9 e^{-j180°} + D_{10} + D_{11} e^{-j90°})\frac{1}{2\sqrt{2}}$$

$$I_9 = (D_4 e^{-j90°} + D_5 e^{-j180°} + D_6 + D_7 e^{-j90°} + D_8 e^{-j180°} + D_9 e^{-j270°} + D_{10} e^{-j90°} + D_{11} e^{-j180°})\frac{1}{2\sqrt{2}}$$

$$I_{10} = (D_4 e^{-j90°} + D_5 e^{-j180°} + D_6 e^{-j180°} + D_7 e^{-j270°} + D_8 + D_9 e^{-j90°} + D_{10} e^{-j90°} + D_{11} e^{-j180°})\frac{1}{2\sqrt{2}}$$

$$I_{11} = (D_4 + D_5 e^{-j90°} + D_6 e^{-j90°} + D_7 e^{-j180°} + D_8 e^{-j90°} + D_9 e^{-j180°} + D_{10} e^{-j180°} + D_{11} e^{-j270°})\frac{1}{2\sqrt{2}}$$

Where $d_0$–$d_{11}$ are the amplified signal components provided by amplifiers 110a–110l respectively, and $I_0$–$I_{11}$ are the output signals appearing at outputs 102a–102l respectively.

It shall be appreciated that $d_0$–$d_{11}$ as appear in the signal component equations (the first set of equations shown above) and as appear in the signal recombination equations (the second set of equations shown above) are directly related by the gain factor of amplifiers 110a–110l (i.e., $D_1 = Gd_1$ where G is the gain factor of the associated amplifier). For example, $d_0$ as used in the signal component equations multiplied by the gain factor of amplifier 110a is equal to $D_0$ as used in the recombination equations.

For simplicity, unity gain, G=1, may be assumed of all amplifiers 110a–110l and, using Euler's formula, $e^{-j\theta} = \cos\theta - j\sin\theta$, the above equations may be easily solved to show that the present invention provides a 12×12 square matrix with a diagonal of ones and all other elements zero. As such, it shall be appreciated that the present invention provides distributed amplification of twelve input signals by utilizing only twelve amplifiers and yet theoretically very accurately reconstructing the output amplified signal.

In addition to the advantages associated with utilizing only twelve amplifiers to provide distributed amplification of twelve discrete inputs (or any even number of amplifiers and inputs), the present invention offers advantages associated with utilizing only a subset of the available number of amplifiers for amplification of any one input signal. A table showing the amplifiers used with respect to any particular input is shown below.

| Inputs | Associated Amplifiers |
| --- | --- |
| 101a, 101b, 101c, and 101d | 110a, 110b, 110c, 110d, 110e, 110f, 110g, and 110h |
| 101e, 101f, 101g, and 101h | 110a, 110b, 110c, 110d, 110i, 110j, 110k, and 110l |
| 101i, 101j, 101k, and 101l | 110e, 110f, 110g, 110h, 110i, 110j, 110k, and 110l |

From the above table it can readily be seen that a signal input at any input 101a–101l is only provided to eight of the twelve available amplifiers. This arrangement provides advantages in that, in addition to still providing a useful output signal upon failure of an amplifier, four of the twelve outputs will be unaffected by the failure of any one amplifier. For example, failure of amplifier 110a will not affect the outputs associated with inputs 101i–101l (i.e., outputs 102i–102l will experience no cross-talk or signal degradation because of a failure of amplifier 110a).

Of course, outputs 102a–102h will experience cross-talk or signal degradation caused by signal components no longer canceling or combining to produce nulls, etc. The theoretical effect of the failure of an amplifier may be calculated using the above equations by removing the signal component associated with the particular amplifier experiencing failure (i.e., remove $D_0$ to simulate a failure of amplifier 110a).

Not only does the present invention provide the advantage of experiencing undesired signal characteristics at only a subset of the signal outputs for any particular amplifier failing, but additional advantage is realized by the fact that the total number of amplifiers utilized is fewer than the prior art apparatus, utilizing a 16×16 Butler or hybrid matrix to provide distributed amplification for twelve discrete inputs. In the prior art, not only will every output signal be affected by the failure of any amplifier, but undesired signal characteristics will be experienced at all sixteen outputs even where only twelve inputs are utilized.

Of course, as the signal components are distributed across fewer amplifiers in the present invention, a trade off exists in that an amplifier failure results in cross-talk experienced at fewer output ports while the power loss of the desired signal is greater than where a larger number of amplifiers are used. The tables below compare the theoretical performance of the distributed amplifier of the present invention to that of the prior art.

| Number of Amplifer Failures | 16 × 16 Distributed Amplifier Matrix (Prior Art) | 12 × 12 Distributed Amplifier Matrix (Present Invention) |
| --- | --- | --- |
| POWER LOSS IN DESIRED PORT | | |
| 1 | 0.53 dB | 1.17 dB |
| 2 | 1.17 dB | 2.5 dB |
| 3 | 1.82 dB | 4.08 dB |
| MAXIMUM CROSS-TALK | | |
| 1 | −24.1 dB | −18.2 dB |
| 2 | −18.2 dB | −12.0 dB |
| 3 | −15.1 dB | −8.5 dB |

It shall be appreciated that in the 12×12 matrix of the present invention, although the maximum cross-talk value for any number of amplifier failures is slightly degraded over that of the prior art 16×16 matrix, cross-talk will be experienced at only eight ports, with the remaining four ports not experiencing any theoretical cross-talk. Therefore, provided the loss in power at any particular port is acceptable, the present invention may provide more desirable output signals upon the failure of an amplifier.

In an alternative embodiment of the present invention, the loss of power at the desired port experienced due to an amplifier failure is compensated for through an increase in gain at the remaining amplifiers. Accordingly, a control circuit (not shown) could be added to the distributed amplifier of FIG. 4 to monitor the outputs of the amplifiers 110a–110l. Upon detecting a failure of any amplifier, the gain of any amplifiers remaining operational could be adjusted to compensate for the loss in power of the desired output signal.

Figure 3:
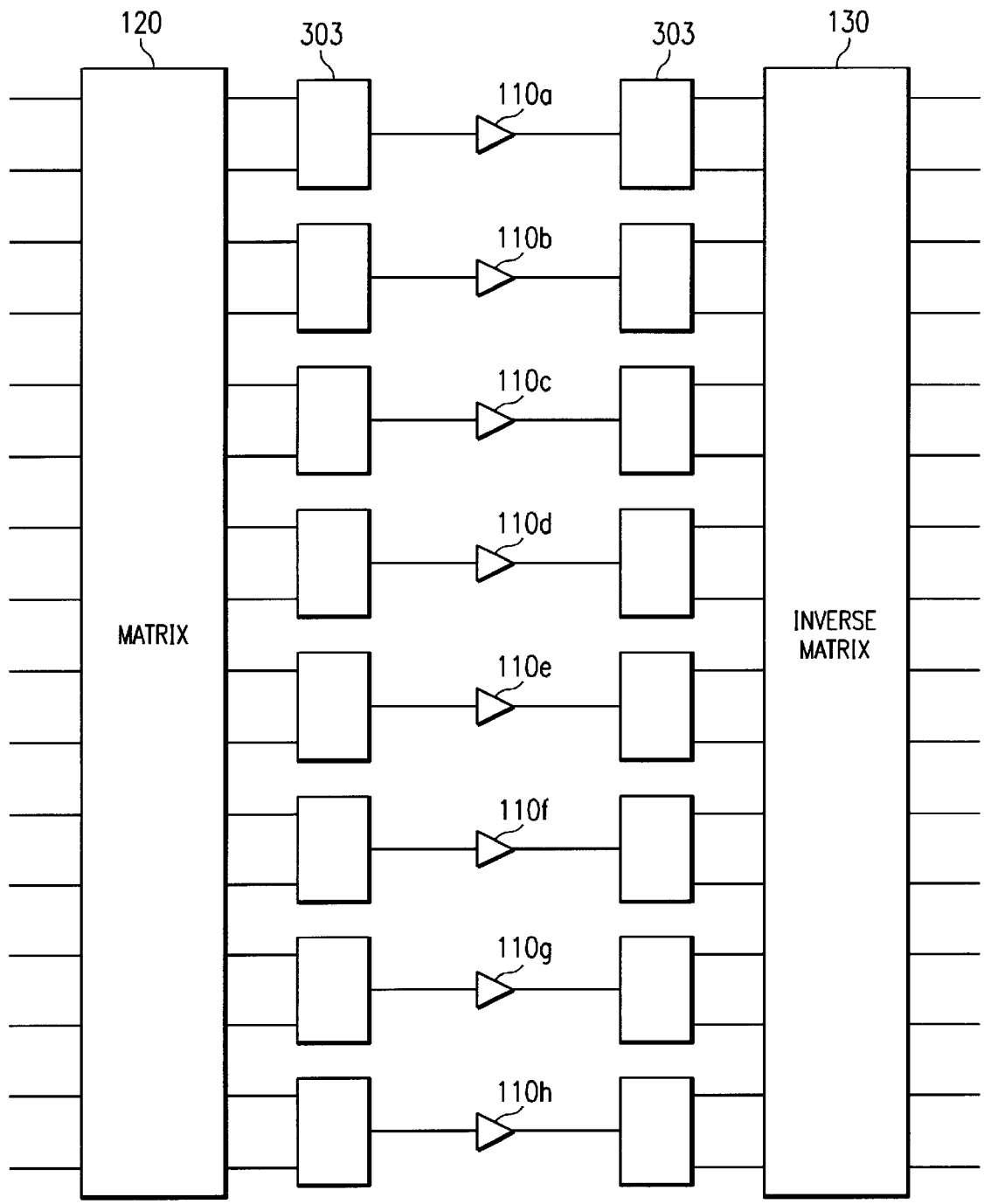
FIG. 3 shows combining of signal components for amplification according to one embodiment of the present invention.

In another alternative embodiment of the present invention, the number of amplifiers utilized may be further reduced through use of the aforementioned Wilkinson combiners as illustrated in FIG. 3. Of course, the use of such combiners to reduce the number of amplifiers will result in the highly diagonalized matrix, referred to above as being a 12×12 square matrix with a diagonal of ones and all other elements zero, being affected as discussed above. However, it shall be appreciated that, as only a subset of the amplifiers are utilized for any one input signal, the use of such combiners will have a less severe effect on the desired output signal than when used in the prior art apparatus.

Furthermore, referencing FIG. 4 and the table above associating amplifiers with input ports, each input signal is distributed across the amplifiers in such a way so as to make selective combining of signal components straight forward. For example, amplifiers 110a–110b, 110e–110f, and 110i–110j might be replaced with the aforementioned Wilkinson combiner, amplifier, and Wilkinson splitter to result in a total of nine amplifiers utilized in the 12×12 distributed amplifier of the present invention. In such an arrangement each input signal, and thus each output signal, will have only four signal components combined for amplification. The remaining four signal components will remain discrete for amplification. As described above, this provides improved signal recombination as compared to an embodiment combining each of the signal components for amplification. Furthermore, this embodiment provides superior signal recombination as compared to that of the Butler and hybrid matrixes, using this signal combining technique to reduce the number of amplifiers to a like number, as fewer signal components are combined for any particular input/output signal.

Although the present invention has been discussed with reference to a 12×12 distributed amplifier matrix, it shall be appreciated that the present invention is useful in providing distributed amplification of signals appearing at any even number of signal inputs (i.e., inputs numbering 4, 6, 8, 10, 12, 14, 16 . . . ). In each of the inventive distributed amplifier matrixes, the number of signal components, and therefore the number of amplifiers utilized in amplifying a particular input signal, is less than the number of signal inputs. For example, each of the following inventive distributed amplifiers utilize the number of amplifiers, numbering less than the inputs, listed below to manipulate any particular input signal:

Number of Signal Components Associated with Distributed Amplification of Input Signals

| Number of Distributed Amplifier Signal Inputs | Number of Signal Components Associated with a Particular Input |
| --- | --- |
| 6 | 4 |
| 10 | 8 |
| 12 | 8 |
| 14 | 8 |
| 18 | 16 |
| 20 | 16 |
| 24 | 16 |

Figure 5:
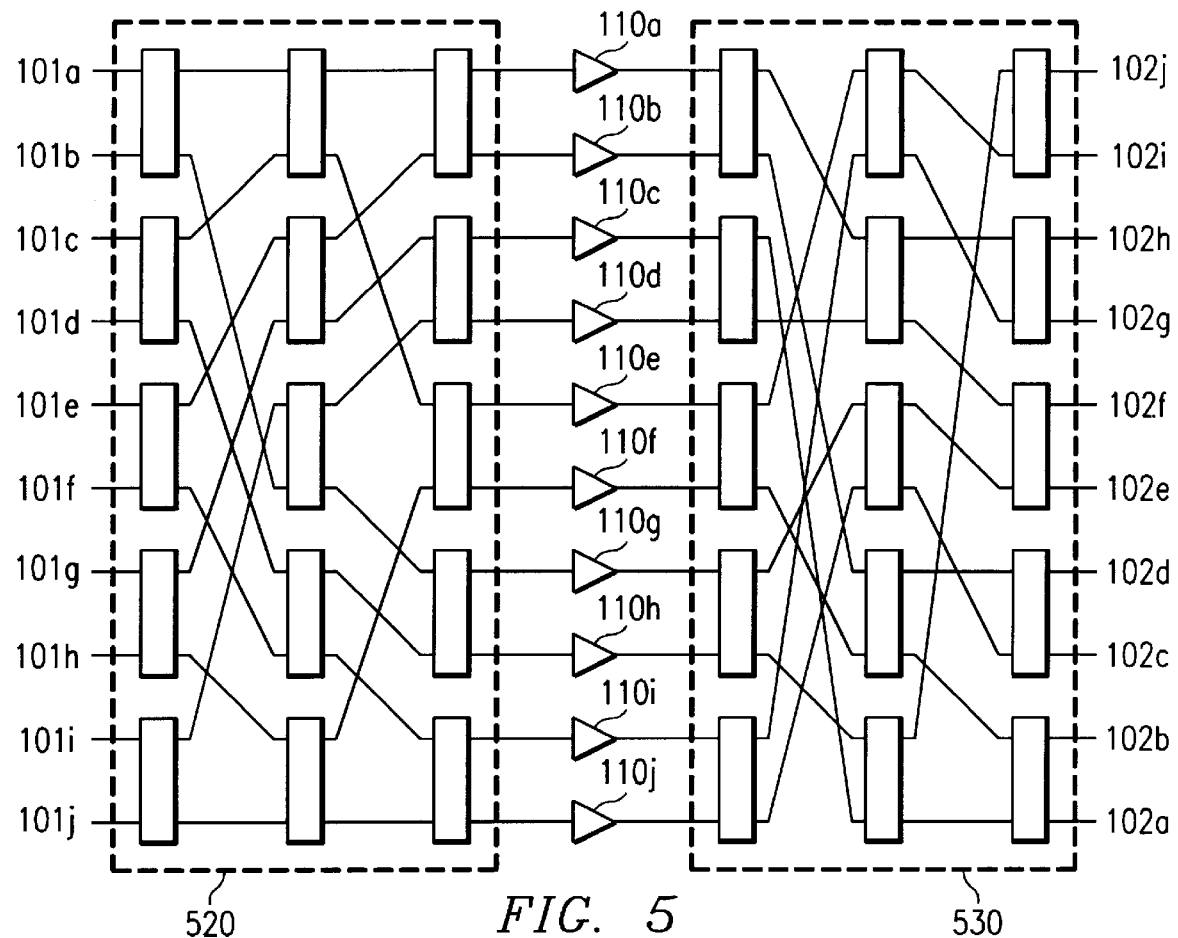
FIG. 5 shows a preferred embodiment of a 10×10 distributed amplifier of the present invention.

Directing attention to FIG. 5, the present invention configured to provide a 10×10 distributed amplifier having input matrix 520 and output matrix 530 is shown. Here inputs 101a–110j are amplified by amplifiers 110a–110j for provision to outputs 102a–102j. As above with the inventive 12×12 distributed amplifier, only a subset of amplifiers 110a–110j are utilized for amplification of any particular input signal 101a–101j. Here, as in the 12×12 distributed amplifier, the number of amplifiers utilized for any single input 101a–101j is eight (as shown in the table above).

Figure 6:
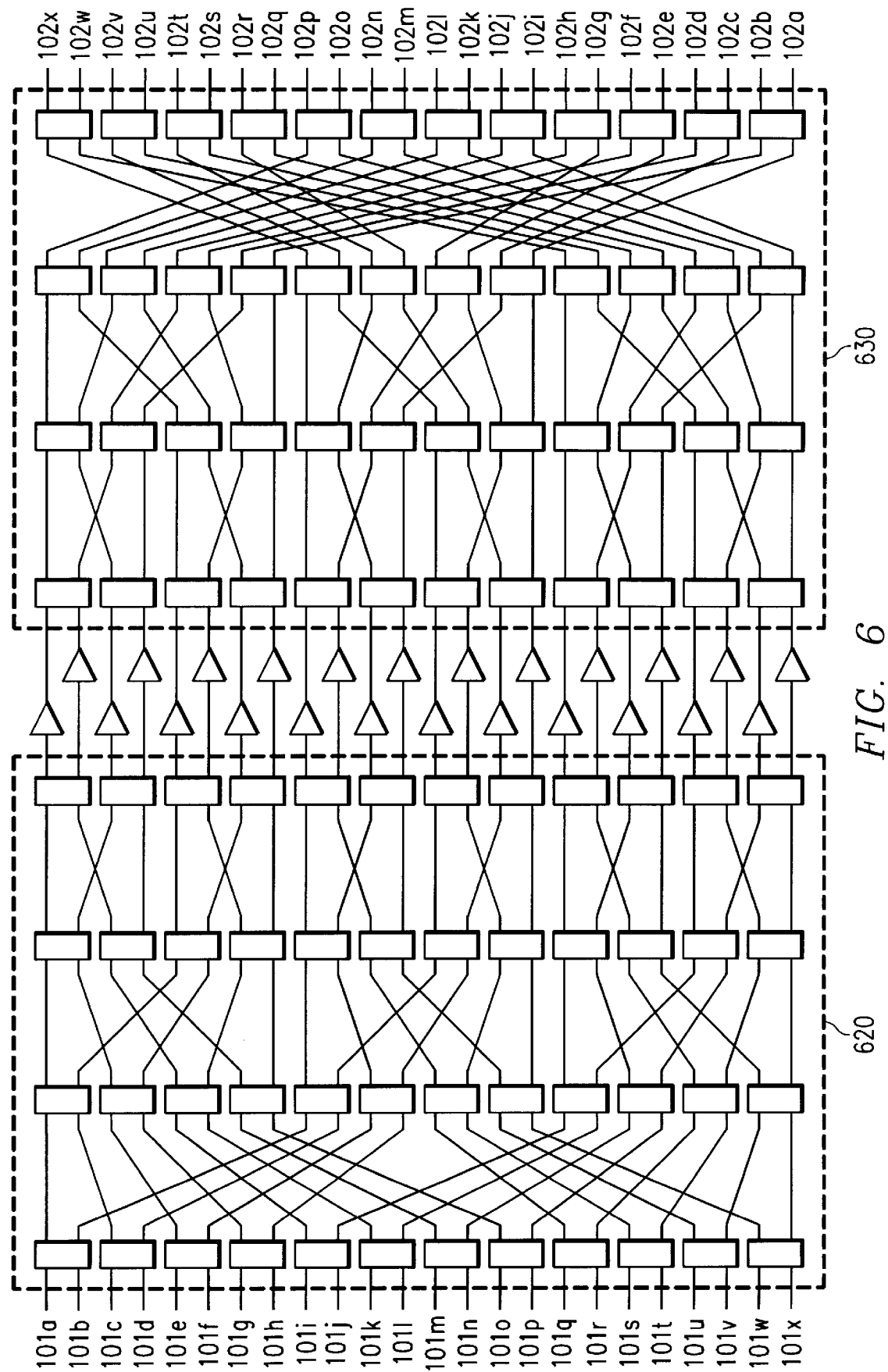
FIG. 6 shows a preferred embodiment of a 24×24 distributed amplifier of the present invention.

Directing attention to FIG. 6, the present invention configured to provide a 24×24 distributed amplifier having input matrix 620 and output matrix 630 is shown. Here inputs 101a–101x are amplified by amplifiers 110a–110x for provision to outputs 102a–102x. As above with the inventive 10×10 and 12×12 distributed amplifiers, only a subset of amplifiers 110a–110x are utilized for amplification of any particular input signal 101a–101x. Here, unlike the 10×10 and 12×12 distributed amplifiers, the number of amplifiers utilized for any single input 110a–110x is sixteen (as shown in the table above).

The above described relationships of the number of amplifiers utilized for any particular input signal in the distributed amplifiers of the present invention may be generalized as follows:
Let
 $S_1$=the number of inputs and amplifiers (an even number)
 $S_2$=the number of amplifiers used for amplification of any one signal
Then
 $S_2=2^n$, where n is an integer equal to the number of stages
If
 $S_3=2^{n+1}$, then $S_3 > S_1 \geq S_2$ From the above, it can be readily seen that the number of amplifiers utilized by any particular input signal is a power of two less than or equal to the number of inputs. Moreover, it can be seen that the number of stages, i.e., the number of columns of hybrid combiners in a matrix, is equal to the particular power of two associated with the number of amplifiers utilized for a signal (i.e., the number of stages=n, where $2^n$ is the number of amplifiers utilized by any particular input signal).

From the above and a review of the distributed amplifiers illustrated in FIGS. 4 through 6, a general procedure for designing matrixes according to the present invention becomes apparent. Although suitable for any arbitrary even number of inputs, this general procedure will be discussed herein with respect to the 12×12 matrix.

Upon selection of the number of inputs (and, therefore, the number of outputs) the number of stages (columns) of hybrid combiners for the input and output matrixes as well as the number of amplifiers utilized by any one input signal may be determined from the above described relationships. Here the largest power of two that is less than or equal to the number of inputs, twelve, is eight $(8=(2)(2)(2)$ or $2^3)$. Therefore we know that there will be three stages of hybrid combiners in the input and output matrixes. Additionally, we know that a stage (column) will, in this case, include six hybrid combiners, since each hybrid combiner includes two inputs (12÷2=6).

Figure 7A:
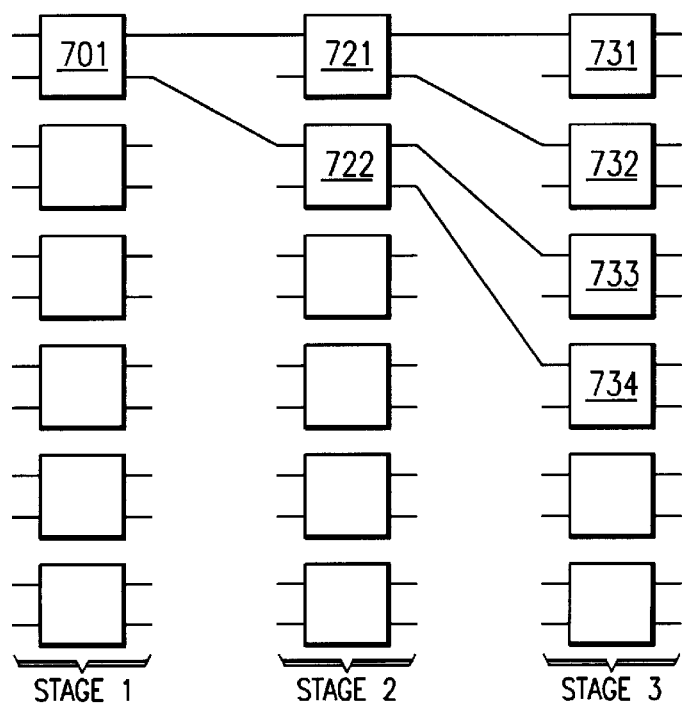
FIGS. 7A through 7C show interconnection of the hybrid combiners of a 12×12 input matrix according to the present invention.

Directing attention to FIG. 7A, the hybrid combiners of a 12×12 input matrix according to the above determinations are shown. According to the present invention, interconnection of the hybrid combiners may be accomplished according to the following regimen:

Step 1, connect the two outputs of a hybrid combiner of the first stage to the inputs of two distinct hybrid combiners in the second stage (shown in FIG. 7A as connecting hybrid combiner 701 to hybrid combiners 721 and 722);

Step 2, connect the two outputs of each second stage hybrid combiner of step 1 with two distinct hybrid combiners in the third stage (shown in FIG. 7A as connecting hybrid combiner 721 to hybrid combiner 731 and 732 and hybrid combiner 722 to hybrid combiner 733 and 734); and Step 3, repeat steps 1 and 2 for each hybrid combiner until all connections have been made, keeping in mind that subsequent connection of outputs of one stage to inputs of another stage should first be made to unused hybrid combiners (i.e., both ports initially not connected) before making connections to hybrid combiners already having an input connected to an output of a previous stage.

Figure 7B:
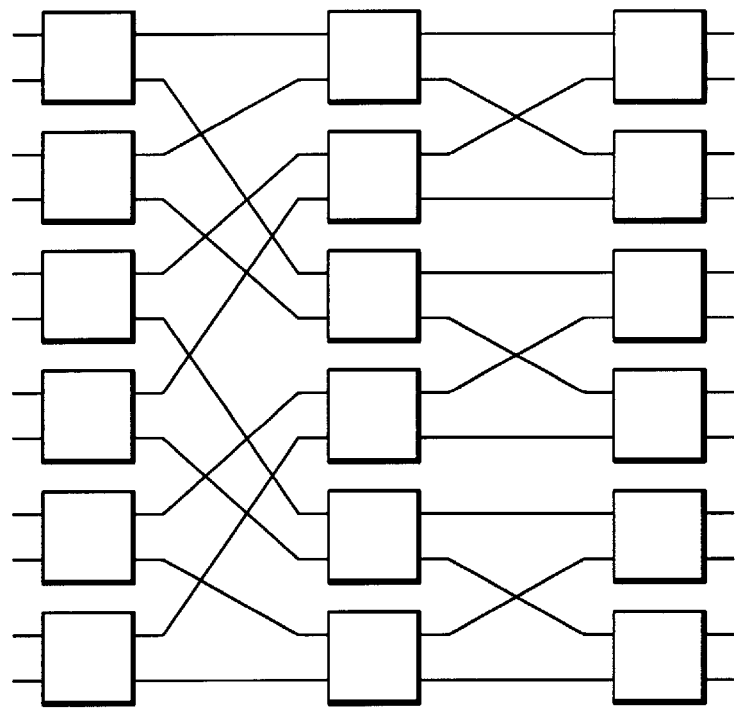
Figure 7C:
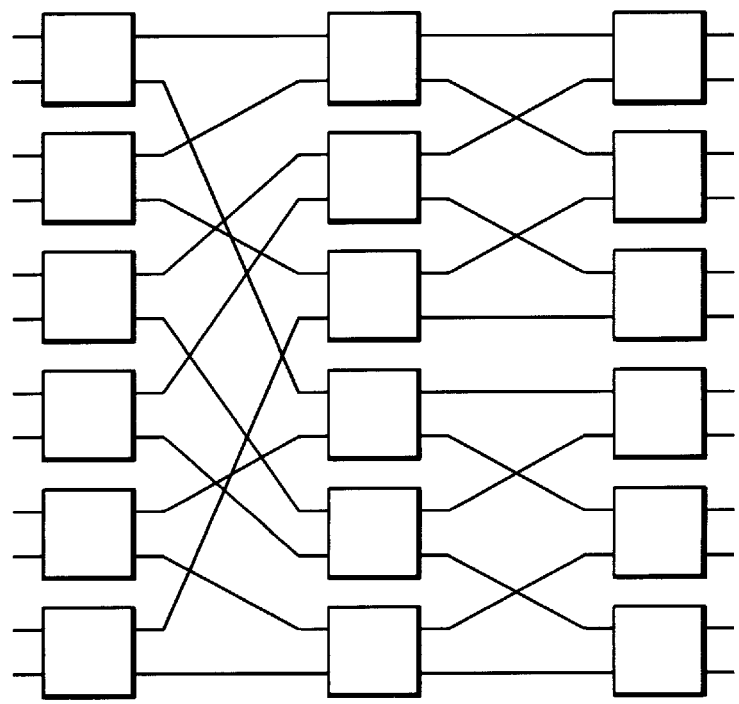

It shall be appreciated that there are a number of solutions possible according to the above regimen. Directing attention to FIGS. 7B and 7C, two such solutions for the 12×12 input matrix are shown.

As the output matrix of the present invention is utilized to recombine the signal components provided by the input matrix, the output matrix must be designed with the input matrix in mind. A regimen for determining the interconnection of the output matrix, remembering that the number of stages of hybrid combiners as well as the number of hybrid combiners in each stage is as determined above, is as follows:

Step 1, write mathematical expressions for the output signals of the input matrix (these expressions are as described above in reference to the signal component equations);

Step 2, based on the desired output signals of the output matrix, write mathematical expressions for the these output signals based on the output signals of the input matrix, realizing that the output signals of the input matrix, are written in terms of the input signal of the input matrix, to achieve a desired output such as $I_1=GA_1$, $I_2=GA_2$, etc. (these expressions are as described above in reference to the signal recombination equations); and Step 3, cascade the previously determined stages of hybrid combiners together to realize the desired output signals as expressed mathematically in step 2.

As above, there is not a unique realization of these expressions. Various schemes of connecting the hybrid combiners of the output matrix will arrive at the same solution.

Although the present invention has been discussed with reference to providing distributed amplification for an even number of input/output signals, it shall be appreciated that advantages are also realized by the present invention when utilized with an odd number of input/output signals. For example, by terminating an input signal path and the corresponding output signal path, the 12×12 distributed amplifier discussed herein may be utilized to provide distributed amplification for eleven input signals. Of course, as in the aforementioned prior art $2^n \times 2^n$ back to back matrixes, distributed amplification of eleven inputs requires a number of LPAs in excess of the number of inputs (here twelve LPAs are utilized for eleven inputs/outputs). However, it should be appreciated that, due to the fact that the present invention is not limited to inputs numbering in powers of two, a significant reduction in the number of LPAs required for the distributed amplification of an odd number is inputs may be realized.

In the present invention the number of LPAs in excess of the number of inputs/outputs will at most be m+1, where m is the number of inputs/outputs. Whereas, in the prior art $2^n \times 2^n$ matrixes the excess number of LPAs will often be significantly greater. In the eleven input/output example above, for instance, the number of excess LPAs required in the prior art is five, as the power of two nearest to eleven is sixteen (i.e., the smallest power of two less than or equal to eleven is twelve).

It shall be appreciated that, although the present invention has been discussed herein with respect to distributed amplification, the invention is not limited to such applications. Specifically, the present invention may be utilized to distribute, and subsequently recombine, signals from any even number of signal inputs for any purpose. For example, the present invention may be utilized to distributively attenuate or filter signals by replacing the aforementioned amplifiers with attenuators or filters.

Although the present invention and its advantages have been described in detail, it should be understood that various changes, substitutions and alterations can be made herein without departing from the spirit and scope of the invention as defined by the appended claims.

What is claimed is:

1. A distributed signal manipulation system comprising:
   a plurality of input ports, wherein the number of input ports of said plurality of input ports is any even number not a power of two;
   a plurality of output ports wherein the number of said output ports of said plurality of output ports is the same as said number of input ports;
   means for dividing a signal input at any one of said plurality of input ports into a plurality of signal components, wherein the number of signal components of said plurality of signal components is less than said number of input ports;
   means for combining said plurality of signal components into an output signal; and
   means for independently manipulating ones of said signal components, said manipulating means providing manipulated signal components for combining by said combining means.

2. The system of claim 1, wherein said signal manipulation means comprises:
   at least one linear power amplifier, and wherein said output signal includes an amplified aspect of said input signal.

3. The system of claim 2, wherein the number of said linear power amplifiers is equal to said number of input ports.

4. The system of claim 3, wherein substantial cross-talk is experienced at only a subset of said plurality of signal output ports upon a failure of one of said linear power amplifiers.

5. The system of claim 1, wherein substantial cross-talk is experienced at only a subset of said plurality of output ports upon a partial failure of said manipulating means.

6. The system of claim 1, wherein said dividing means provides substantially different signal paths than said combining means.

7. The system of claim 1, wherein said dividing means comprises:
   a plurality of 90° hybrid combiners interconnected in a predetermined manner.

8. The system of claim 1, wherein said combining means comprises:
   a plurality of 90° hybrid combiners interconnected in a predetermined manner.

9. The system of claim 1, wherein said number of said plurality of input ports is selected from the group consisting of six, ten, twelve, fourteen, eighteen, twenty, and twenty-four.

10. The system of claim 9, wherein said number of said signal components said input signal is divided into by said dividing means is selected from the group consisting of four, eight, and sixteen.

11. The system of claim 1, further comprising:
    means for summing at least two of said signal components, said summing means being coupled between said dividing means and said manipulating means; and
    means for splitting at least one of said summed signals after said summed signal has been manipulated by said manipulating means, said splitting means being coupled between said manipulating means and said combining means.

12. A method for providing distributed signal manipulation, said method comprising the steps of:
    selecting a number of discrete signals for which to provide said distributed signal manipulation, wherein said number selected may be any even number;
    providing a plurality of input ports equal to the number selected in said selecting step;
    providing a plurality of output ports equal to the number of said input ports;
    dividing an input signal input at any of said input ports into a plurality of signal components, wherein the number of signal components of said plurality of signal components is the greatest power of two not larger than said number of input ports;

manipulating said plurality of signal components, said manipulating step providing a plurality of manipulated signal components; and combining said plurality of manipulated signal components into an output signal, wherein said output signal is a function of said input signal.

13. The method of claim 12, wherein said manipulating step comprises the step of amplifying said signal components.

14. The method of claim 13, wherein said manipulating step utilizes a subset of amplifiers of a plurality of amplifiers, and wherein the number of amplifiers in said plurality of amplifiers is equal to said number of input ports provided in said providing step.

15. The method of claim 12, wherein said dividing step utilizes substantially different signal paths than said combining step.

16. The method of claim 12, further comprising the step of:

interconnecting a plurality of 90° hybrid combiners to be utilized in dividing said input signal at said dividing step, wherein said plurality of 90° hybrid combiners are associated with signal dividing stages equal in number to the exponent of said power of two.

17. The method of claim 12, further comprising the step of:

interconnecting a plurality of 90° hybrid combiners to be utilized in combining said input signal at said combining step, wherein said plurality of 90° hybrid combiners are associated with signal combining stages equal in number to the exponent of said power of two.

18. The method of claim 12, wherein said number selected in said selecting step is not a power of two.

19. The method of claim 12, further comprising the steps of:

summing at least two of said plurality of signal components for manipulation at said manipulating step; and splitting at least one of said summed signals after said summed signal has been manipulated in said manipulating step.

20. A distributed signal manipulation system comprising:

an input signal path matrix having a plurality of input ports and a plurality of output ports, wherein said input signal path matrix is adapted to divide a signal input at any one of said input ports into a plurality of signal components;

an output signal path matrix having a plurality of output ports and a plurality of input ports, wherein said output signal path matrix is adapted to combine said plurality of signal components into an output signal, and wherein said output signal path matrix provides a substantially different arrangement of signal paths than said input signal path matrix; and a plurality of amplifiers for independently manipulating ones of said plurality of signal components, said plurality of amplifiers providing manipulated signal components for combining by said output signal path matrix, wherein said output signal is an amplified rendition of said input signal.

21. The system of claim 20, wherein said amplifiers of said plurality of amplifiers are linear power amplifiers.

22. The system of claim 20, wherein the number of amplifiers of said plurality of amplifiers is equal to the number of input ports of said plurality of input ports of said input signal path matrix.

23. The system of claim 22, wherein undesired signals are experienced at only a subset of said plurality of signal output ports of said output signal path matrix upon a failure of one of said amplifiers.

24. The system of claim 20, wherein said input signal path matrix comprises a hybrid matrix including 90° hybrid combiners.

25. The system of claim 20, wherein said output matrix comprises a hybrid matrix including 90° hybrid combiners.

26. The system of claim 20, wherein the number of input ports of said plurality of input ports of said input signal path matrix is any even number.

27. The system of claim 20, wherein the number of input ports of said plurality of input ports of said input signal path matrix is selected from the group consisting of six, ten, twelve, fourteen, eighteen, twenty, and twenty-four.

28. The system of claim 20, wherein said number of signal input ports of said input signal path matrix and of said signal output ports of said output signal path matrix is twelve.

29. The system of claim 28, wherein said number of said plurality of output ports of said input signal path matrix to which at least a portion of said input signal applied to any one of said plurality of signal input ports of said input signal path matrix is provided is eight.

30. The system of claim 20, further comprising:

a signal combiner coupled to at least two of said plurality of output ports of said input signal path matrix; and a signal splitter coupled to at least two of said plurality of input ports of said output signal path matrix, wherein at least one of said plurality of amplifiers is coupled to at least two of said plurality of output ports of said input signal path matrix through said signal combiner and said at least one of said plurality of amplifiers is coupled to at least two of said plurality of input ports of said output signal path matrix through said signal splitter.

31. A system providing distributed manipulation of an input signal applied to a signal input port of a plurality of signal input ports to result in an output signal having a predetermined manipulated aspect at a particular signal output port of a plurality of signal output ports corresponding to said signal input port, said system comprising:

an input signal path matrix providing said plurality of signal input ports and a plurality of distributed signal output ports, wherein at least a portion of said input signal is provided to ones of said plurality of distributed signal output ports, and wherein said ones of said plurality of distributed signal output ports is the greatest power of two not larger than said plurality of signal input ports;

an output signal path matrix providing said plurality of signal output ports and a plurality of distributed signal input ports, wherein signals applied to ones of said distributed signal input ports are combined to provide said output signal, wherein said output signal path matrix provides a substantially different arrangement of signal paths than said input signal path matrix; and a plurality of signal manipulation devices coupled to said input signal path matrix and said output signal path matrix providing manipulation of signals appearing at ones of said plurality of distributed signal output ports of said input signal path matrix for input into ones of said plurality of distributed signal input ports of said output signal path matrix.

32. The system of claim 31, wherein one of said signal manipulation devices comprise linear power amplifiers, and wherein said output signal is an amplified rendition of said input signal.

33. The system of claim 31, wherein said input signal path matrix does not present an inverse signal path of said output signal path matrix.

34. The system of claim 31, wherein said input signal path matrix comprises:
   a hybrid matrix including 90° hybrid combiners disposed in a number of stages equal to the exponent of said power of two.

35. The system of claim 31, wherein said output signal path matrix comprises:
   a hybrid matrix including 90° hybrid combiners disposed in a number of stages equal to the exponent of said power of two.

36. The system of claim 31, wherein said number of signal input ports of said plurality of signal input ports of said input signal path matrix is twelve.

37. The system of claim 31, wherein the number of said distributed signal output ports of said input signal path matrix to which at least a portion of said input signal is provided is eight.

38. The system of claim 31, wherein a failure of any one of said signal manipulation devices results in said output signal experiencing a power loss of approximately 1 dB.

39. The system of claim 31, wherein a failure of any one of said signal manipulation devices results in a maximum cross-talk of approximately 18 dB.

40. The system of claim 39, wherein said cross-talk is experienced at only a subset of said plurality of signal output ports.

41. The system of claim 31, further comprising:
   a signal summer coupled to at least two of said distributed signal output ports of said input signal path matrix; and
   a signal splitter coupled to at least two of said distributed signal input ports of said output signal path matrix, wherein a signal manipulation device of said plurality of signal manipulation devices is coupled to at least two of said distributed signal output ports of said input signal path matrix through said signal summer and said signal manipulation device is coupled to at least two of said distributed signal input ports of said output signal path matrix through said signal splitter.

* * * * *